United States Patent
Lin

(10) Patent No.: US 8,987,667 B2
(45) Date of Patent: Mar. 24, 2015

(54) SYSTEMS AND METHODS FOR IMAGE LAG MITIGATION FOR BUFFERED DIRECT INJECTION READOUT WITH CURRENT MIRROR

(71) Applicant: Sensors Unlimited, Inc., Princeton, NJ (US)

(72) Inventor: Minlong Lin, Princeton, NJ (US)

(73) Assignee: Sensors Unlimited, Inc., Princeton, NJ (US)

( * ) Notice: Subject to any disclaimer, the term of this patent is extended or adjusted under 35 U.S.C. 154(b) by 134 days.

(21) Appl. No.: 13/895,288

(22) Filed: May 15, 2013

(65) Prior Publication Data
US 2014/0340154 A1    Nov. 20, 2014

(51) Int. Cl.
*G01J 5/00* (2006.01)
*H03F 3/345* (2006.01)
*H01L 27/146* (2006.01)

(52) U.S. Cl.
CPC .......... *H03F 3/345* (2013.01); *H01L 27/14649* (2013.01)
USPC ....................................... 250/338.1; 348/300

(58) Field of Classification Search
CPC ........................... H01L 27/14649; H03F 3/345
USPC ....................................... 250/338.1; 348/300
See application file for complete search history.

(56) References Cited

U.S. PATENT DOCUMENTS 5,382,977 A * 1/1995 Kozlowski et al. ........... 348/300

OTHER PUBLICATIONS

Yoon et al., Design and implementation of infrared readout circuit using a new input circuit of current mirroring direct injection (CMDI), Opto-Electronics Review 7(4), 321-236 (1999).*

* cited by examiner

*Primary Examiner* — David Porta
*Assistant Examiner* — Abra Fein
(74) *Attorney, Agent, or Firm* — Cantor Colburn LLP

(57) ABSTRACT

Embodiments relate to systems and methods for image lag mitigation for a buffered direct injection readout circuit with current mirror. A photo detector device is coupled to a buffered direct injection (BDI) circuit, in which an operational amplifier and other elements communicate the output signal from the detector to subsequent stages. The BDI output is transmitted to a first current mirror, which can be implemented as a Säckinger current mirror. The first current mirror is coupled to a second current mirror, one of whose outputs is a fixed bias current. Image lag can be controlled by the fixed bias current, rather than the photocurrent produced directly by the optical detector. In aspects, the negative feedback provided by the first current mirror can increase the modulation of the second current mirror. This gain factor can reduce image lag to a significantly lower point than the lag experienced by known BDI-current-modulated readout circuitry without Säckinger current mirror.

15 Claims, 2 Drawing Sheets

SYSTEMS AND METHODS FOR IMAGE LAG MITIGATION FOR BUFFERED DIRECT INJECTION READOUT WITH CURRENT MIRROR

FIELD

The present teachings relate to systems and methods for image lag mitigation for buffered direct injection readout circuitry with a current mirror, and more particularly, to platforms and techniques for reducing the settling time in optical sensors using buffered direct injection readout.

BACKGROUND

In the field of optical sensors, the use of optical sensors to detect images in the infrared (IR) and other spectra has been known. Optical detectors such as InGaAs (Indium Gallium Arsenide) or other sensors in the IR band and other frequencies have been deployed in a focal plane with silicon readout circuits. Typically, the current output from the detector device has been delivered to an integration capacitor through an injection MOSFET which, in turn, is gated by a buffer to reduce the detector reverse-bias variations which arise due to photocurrent variations. This configuration is referred to as a buffered direct injection (BDI) readout circuit. A BDI circuit configuration according to known implementations is shown in FIG. 1

The output from the BDI portion of those implementations can be delivered to a current mirror, as also shown in FIG. 1. The current mirror is used to either amplify or attenuate the input photocurrents in order to detect daylight-to-starlight scenes. By varying the voltage differences between BIAS and GAIN in FIG. 1, the ratio between $I_{out}$ and $I_{in}$ in FIG. 1 can vary by several orders of magnitude. The right-hand portion of the network is used to reset an integration capacitor used to control the timing of the light-gathering interval performed by the BDI or other readout circuits.

However, in known BDI implementations such as that shown in FIG. 1, there are difficulties in the performance of the optical sensing and output generated by the BDI and current mirror circuits. Specifically, and as for instance shown in FIG. 2, the operating characteristics of the current mirror portion of the circuit, when driven by the buffered current generated by the BDI portion of the circuit, can cause significant delay in the settling time of the scene being imaged, particularly when there is a large change in the amount of luminance in the scene.

That is, and as likewise shown in FIG. 2, when a BDI or other readout circuit is capturing an image with significant brightness variation in consecutive scenes, the readout circuit cannot respond to the scene brightness variations within a reasonable time frame. In FIG. 2, a bright scene occurs at frame 0, while at frame 1 the full brightness cannot be displayed. Rather, full brightness can only be displayed at frame 2. This is referred as "frontend" lag in FIG. 2. Then, at frame 2, the bright scene is switched to dark scene, and the display takes much longer time to settle to the dark scenes in an effect displayed in FIG. 2 as "backend" lag. During that type of flare or other transition, the sensor device may not be able to respond quickly enough to the rapid change in overall luminance of the scene to accurately generate output signal values. This image lag is, in part, caused by the charging/discharging of the capacitance of the current mirror portion of the circuit in FIG. 1. The backend lag time constant, $\tau$, can be estimated according to the expression:

$$\tau = RC$$

R is the effective impedance at current mirror gate node and can be in the range of several hundreds of giga-$\Omega$ in dark scene. A simple estimation of R can be related to the transconductance, $g_m$, of Min transistor in FIG. 1. $R \approx 1/g_m \approx (1.5 * kT/q)/I_{in}$ where k is Boltzmann constant, T is temperature, q is electron charge and $I_{in}$ is photocurrent. If T=300° K and photocurrent=0.1 pA, R is almost 400 G$\Omega$. C is the effective capacitance at the current mirror gate node. That is, from the bright scene to the dark scene, the time constant to settle the discharging of current mirror gate node can be many tens of milli-seconds. Since the typical frame time is 33 mS, it is not surprising that backend image lag can last for several frames, which can significantly affect image quality or accuracy, under transitional luminance conditions.

It may be desirable to provide methods and systems for image lag mitigation for buffered direct injection readout circuitry with a current mirror, in which optical sensors can deliver image signals via a BDI portion which in turn feeds a current mirror topology that provides improved response time for changing image conditions.

DESCRIPTION OF DRAWINGS

The accompanying drawings, which are incorporated in and constitute a part of this specification, illustrate embodiments of the present teachings and together with the description, serve to explain the principles of the present teachings. In the figures.

DESCRIPTION OF EMBODIMENTS

Embodiments of the present teachings relate to systems and methods for image lag mitigation for buffered direct injection circuitry with current mirror. More particularly, embodiments relate to platforms and techniques for collecting the signals generated by optical sensors from an InGaAs or other sensor array, while reducing the lag time required for the output of the sensors to settle when transitioning from a high-brightness scene to a low-brightness scene, or during other transitions in the imaging environment.

Reference will now be made in detail to exemplary embodiments of the present teachings, which are illustrated in the accompanying drawings. Where possible the same or similar reference numbers will be used throughout the drawings to refer to the same or like parts.

Figure 3:
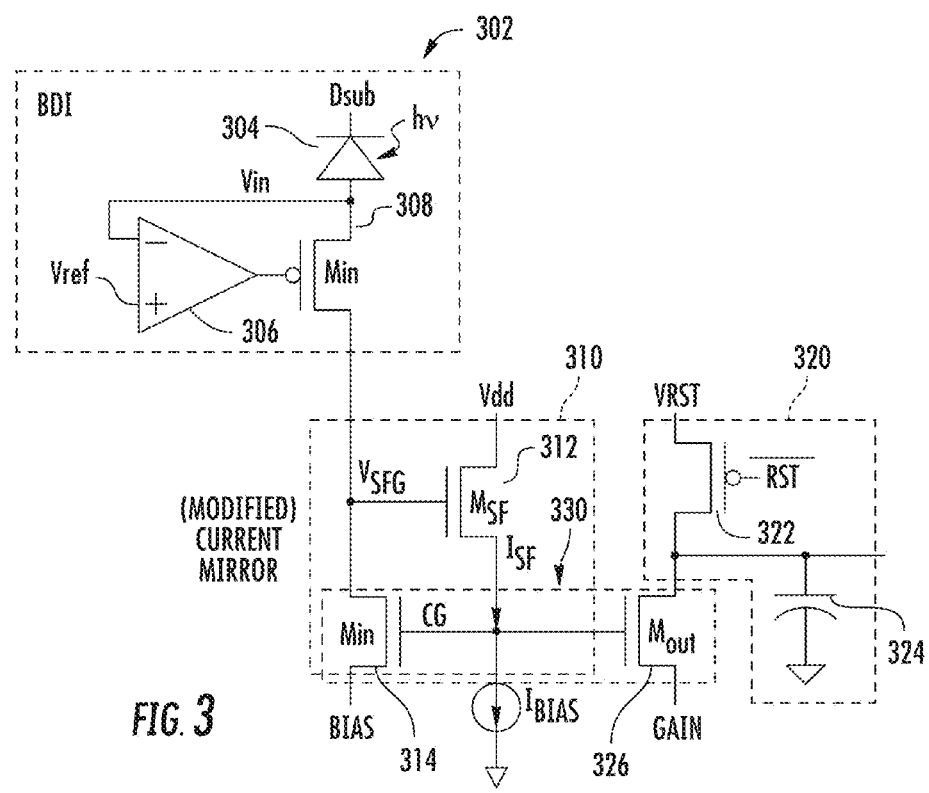
FIG. 3 illustrates an overall optical detection system incorporating BDI and current mirror circuitry, according to various aspects of the present teachings.

FIG. 3 illustrates a set of overall circuitry 300 in which systems and methods for image lag mitigation for buffered direct injection circuitry with a current mirror can operate, according to implementations. In aspects as shown, that circuitry 300 can include a BDI module 302. The BDI module 302 can include an optical detector 304, which can be or include an InGaAs detector or other optical sensing element. In implementations, the optical detector 304 can be configured for enhanced low-level performance, for instance to be subjected to liquid cooling for lower noise and better low-light sensitivity. Light which impinges on the optical detector 304 can trigger current flow through a buffer section consisting of a transistor 308, coupled to an operational amplifier 306. The output provided by the BDI module 302 can be coupled to a first current mirror 310.

The first current mirror 310 can contain elements configured to provide a current mirror function, particularly, a first transistor 312 (labeled $M_{SF}$) and a second transistor 314 (labeled as $M_{in}$). According to implementations, the first current mirror 310 can be or include Säckinger current mirror, which can operate or function as a reduced version of a regulated cascode current mirror.

In implementations as shown, the set of overall circuitry 300 can further include a second current mirror 330. The second current mirror 330 can include the second transistor 314, along with a third transistor 326 (labeled $M_{out}$). In addition, the set of overall circuitry 300 can include a reset switching module 320, which can operate to reset an integration capacitor 324 via a reset switch 322, in order to charge the integration capacitor 324 for a new frame or other imaging interval.

Figure 1:
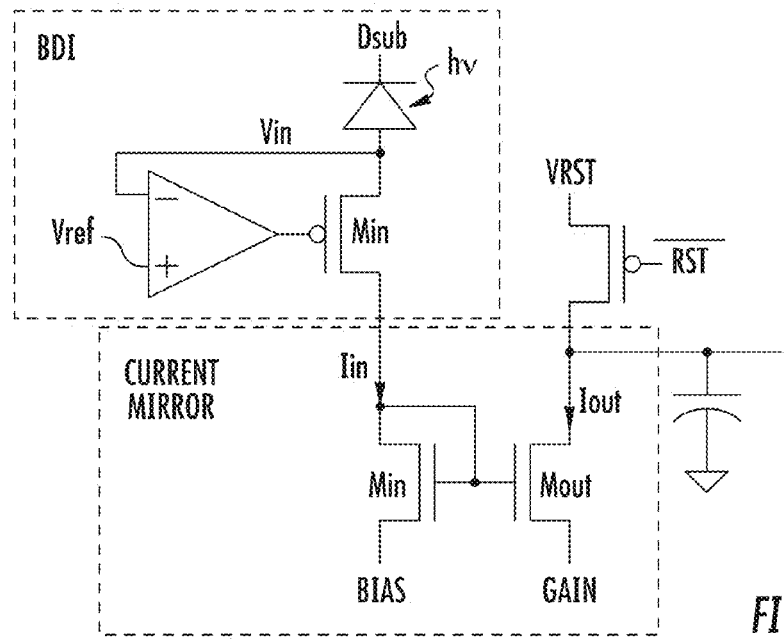
FIG. 1 illustrates optical detection systems which employ BDI circuitry, according to known implementations.
Figure 2:
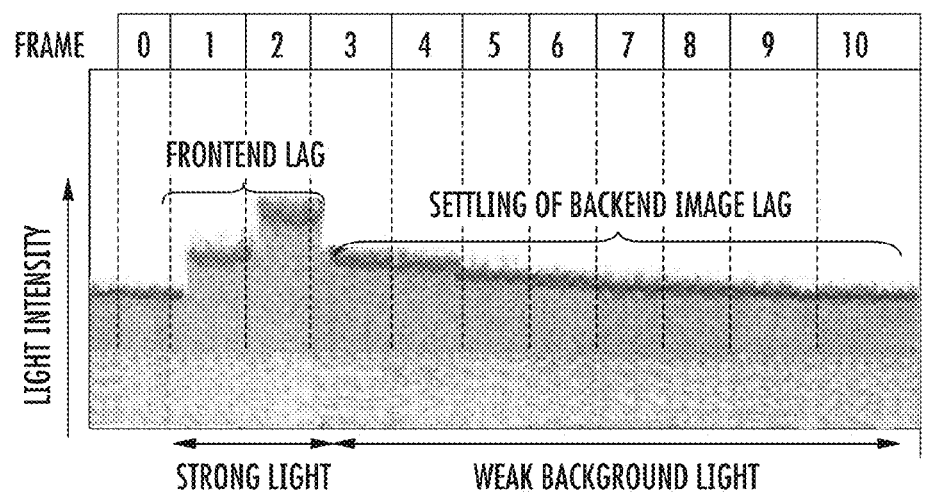
FIG. 2 illustrates signal response characteristics of optical detection systems shown in FIG. 1, in bright-to-dark transitional conditions.

According to aspects, the current $I_{SF}$ can drive the current output in both sides of the second current mirror 330, which in turn provides an amplified/attenuated photocurrent generated by the optical detector 304 by varying the voltage difference between BIAS and GAIN (e.g. as shown in FIG. 1). The current $I_{BIAS}$ reflects current transmitted through the first current mirror 310, and can be a fixed current value. According to aspects, the lag mitigation of the sensed image can be controlled by the modulating current of $I_{SF}$, rather than by the value of the photocurrent produced by the optical detector 304. The current $I_{SF}$ can in contrast reflect a charge/discharge current from the gate node of both $M_{in}$ and $M_{out}$ in FIG. 1. Based on the variation of the voltage value $V_{SFG}$ from light brightness, the current $I_{SF}$ and the gate charge/discharge current of current mirror 310 modulate against each other with respect to the constant current, $I_{BIAS}$ in FIG. 1. When a bright scene is switched to a dark scene, the decrease of $V_{SFG}$ value will decrease $I_{SF}$, which, in turn, will increase the discharging current from gate node of both $M_{in}$ and $M_{out}$ since $I_{BIAS}$ is fixed. This accelerated discharging current from the gate node of both $M_{in}$ and $M_{out}$ will have the effect of reducing backend lag. According to aspects, the same principle applies to the mitigation of front-end lag. According to aspects, the negative feedback provided by the first current mirror 310 can increase the modulation of the first transistor 312 by a factor of $(g_{m\text{-}Min})/(g_{ds\text{-}Min})$. This gain factor can drive the image lag produced by the BDI module 302 and following current mirror circuitry to a significantly lower point than the lag experienced by known BDI-driven readout circuitry with current mirror. Faster, less noisy, and/or more accurate imaging in the IR or other bands can therefore be achieved.

It may be noted that the set of overall circuitry 300 including the BDI 302, the first current mirror 310, the second current mirror 330, and the reset switching module 320 can be implemented as the detector element for a single pixel in a focal plane array. A large number of those pixel elements can be fabricated using large scale integration (LSI) to form an integrated sensing unit that can image a large number of combined pixels, each of whose output is regulated using circuits and techniques disclosed herein. The aggregate sensing unit can, again, be configured to capture images in the IR band, and/or other frequency ranges.

The foregoing description is illustrative, and variations in configuration and implementation may occur to persons skilled in the art. For example, while embodiments have been described in which a BDI module 302 is configured using operational amplifier 306, transistor 308, and optical detector 304 configured in a certain arrangement, in implementations, those elements can be configured in different topologies or arrangements, and/or can be substituted with other electrical elements. Similarly, while the first current mirror 310 and second current mirror 330 have been illustrated as being configured with certain transistor elements in illustrative arrangements, it will be appreciated that in implementations, those elements can also be configured in different topologies or arrangements, and/or substituted with other electrical elements. Other resources described as singular or integrated can in embodiments be plural or distributed, and resources described as multiple or distributed can in embodiments be combined. The scope of the present teachings is accordingly intended to be limited only by the following claims.

What is claimed is:

1. A circuit, comprising:
   a buffered direct injection (BDI) module, the BDI module comprising—
      an optical detector, and
      a buffer connected to an output of the optical detector;
   a first current mirror, coupled to the BDI module, the first current mirror generating a modulating current based on the output of the optical detector;
   a second current mirror, coupled to the first current mirror, the second current mirror being configured to generate either an amplified or attenuated photocurrent operable to optimize an imaging time and scene brightness of the optical detector; and
   a reset circuit, coupled to the second current mirror, and being configured to reset an integration capacitor which integrates an image signal based on the output of the optical detector.

2. The circuit of claim 1, wherein the optical detector comprises an Indium Gallium Arsenide (InGaAs) device or other IR device.

3. The circuit of claim 2, wherein the InGaAs or other IR device is configured to detect images in the infrared frequency range.

4. The circuit of claim 1, wherein the buffer comprises an operational amplifier.

5. The circuit of claim 1, wherein the first current mirror comprises a Säckinger current mirror.

6. The circuit of claim 1, wherein the each of the first current mirror and the second current mirror comprises a pair of coupled transistors.

7. The circuit of claim 6, wherein the first current mirror and the second current mirror share at least one transistor.

8. The circuit of claim 7, wherein the second current mirror comprises at least one output transistor to output the image signal.

9. The circuit of claim 1, wherein the first current mirror generates an increase in modulation of the modulated current via negative feedback.

10. The circuit of claim 1, wherein the reset circuit comprises a switching transistor coupled to the second current mirror.

11. An imaging system, comprising:
    a focal plane array of buffered direct injection (BDI)-driven optical detector elements, wherein—
    each BDI-driven optical detector elements comprises—
       a buffered direct injection (BDI) module, the BDI module comprising—
          an optical detector, and
          a buffer connected to an output of the optical detector;
       a first current mirror, coupled to the BDI module, the first current mirror generating a modulating current based on the output of the optical detector;
       a second current mirror, coupled to the first current mirror, the second current mirror being configured to generate either an amplified or attenuated photocurrent operable to optimize an imaging time and scene brightness of the optical detector; and a reset circuit, coupled to the first current mirror and being configured to reset an integration capacitor which integrates an image signal based on the output of the optical detector;

wherein each BDI-driven optical detector element is formed on a common substrate.

12. The system of claim 11, wherein the optical detector of each BDI module comprises an InGaAs device or other IR device.

13. The system of claim 12, wherein the InGaAs or other IR detector of each BDI module is configured to detect images in the infrared frequency range.

14. The system of claim 11, wherein the buffer of each BDI module comprises an operational amplifier.

15. The system of claim 11, wherein the first current mirror comprises a Säckinger current mirror.

* * * * *